(12) United States Patent
Shin

(10) Patent No.: US 7,307,897 B2
(45) Date of Patent: Dec. 11, 2007

(54) PLURAL BANK SEMICONDUCTOR MEMORY DEVICE WITH INCREASED BOOSTING VOLTAGE STABILITY

(75) Inventor: Dong-Hak Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 11/267,805

(22) Filed: Nov. 4, 2005

(65) Prior Publication Data
US 2006/0120177 A1 Jun. 8, 2006

(30) Foreign Application Priority Data
Nov. 24, 2004 (KR) ...................... 10-2004-0097179

(51) Int. Cl.
*G11C 5/14* (2006.01)
(52) U.S. Cl. .................. 365/189.09; 365/210
(58) Field of Classification Search .......... 365/189.01, 365/189.09, 210, 226, 230.03
See application file for complete search history.

(56) References Cited

U.S. PATENT DOCUMENTS

| | | | |
|---|---|---|---|
| 6,038,178 A * | 3/2000 | Oh | 365/189.09 |
| 6,128,235 A | 10/2000 | Jung | 365/205 |
| 6,172,931 B1 * | 1/2001 | Cha et al. | 365/226 |
| 7,154,785 B2 * | 12/2006 | Roohparvar | 365/185.18 |
| 2001/0050867 A1 | 12/2001 | Song | 365/189.11 |

FOREIGN PATENT DOCUMENTS

| | | |
|---|---|---|
| JP | 2002-015566 | 1/2002 |
| KR | 2000-0014222 | 3/2000 |
| KR | 2003-0057724 | 7/2003 |

\* cited by examiner

*Primary Examiner*—Son Dinh
*Assistant Examiner*—Douglas King
(74) *Attorney, Agent, or Firm*—Mills & Onello LLP

(57) ABSTRACT

A semiconductor memory device includes a memory cell array, and first and second boosting voltage generating portions. The first boosting voltage generating portion generates a first driving signal when the semiconductor device operates in an active mode and supplies a boosting voltage that is higher than a power supply voltage to an output terminal in response to the first driving signal. The second boosting voltage generating portion includes a first boosting voltage generator generating a second driving signal when a level of the boosting voltage of the output terminal is below a target level in the active mode and pumping the boosting voltage in response to the second driving signal and a second boosting voltage generator pumping the boosting voltage in response to the first driving signal when first memory cell array blocks are selected and pumping the boosting voltage in response to the second driving signal when second memory cell array blocks are selected.

14 Claims, 6 Drawing Sheets

PLURAL BANK SEMICONDUCTOR MEMORY DEVICE WITH INCREASED BOOSTING VOLTAGE STABILITY

CROSS-REFERENCE TO RELATED APPLICATION

This application claims the benefit of Korean Patent Application No. 2004-97179, filed Nov. 24, 2004, the disclosure of which is hereby incorporated herein by reference in its entirety.

BACKGROUND OF THE INVENTION

1. Field of the Invention

The present invention relates to a semiconductor memory device, and more particularly, to a semiconductor memory device of an open bit line structure having a boosting voltage generating circuit.

2. Description of the Related Art

In a semiconductor memory device such as a synchronous dynamic random access memory (SDRAM), a boosting voltage which is higher than a power supply voltage, i.e., a boosting voltage which is a power supply voltage plus a threshold voltage of a cell transistor, should be applied to a gate of the cell transistor in order to transmit data stored in a cell capacitor to a bit line.

The boosting voltage is used as a power source of various circuits as well as the gate of the cell transistor. A boosting voltage generating circuit has a boosting voltage detecting circuit to compensate for insufficient charge whenever a level of the boosting voltage is lowered to thereby retain the boosting voltage at a constant level.

FIG. 1 is a schematic view illustrating a memory cell array of an open bit line structure. The memory cell array 100 includes n memory cell array blocks 10-1 to 10-n, bit line sense amplifiers S/A arranged between the memory cell array blocks 10-1 to 10-n, a plurality of memory cells C connected between word lines WL and bit lines BL, and a plurality of dummy memory cells DC connected between the word lines WL and dummy bit lines DBL. Of the memory cell array blocks 10-1 to 10-n, end memory cell array blocks 10-1 and 10-n which are located in an end region of the memory cell array include memory cells C connected between the word lines WL and the bit lines BL, and dummy memory cells DC connected between the word lines WL and the dummy bit lines DBL, and the dummy bit lines DBL are connected to a bit line voltage VBL.

However, in the memory cell array of the open bit line structure, in the case where the end memory cell array blocks 10-1 and 10-n are selected, two word lines WL1 are simultaneously activated. On the other hand, in case where one of the central memory cell array blocks 10-2 to 10-(n−1) which are located in a central region is selected, only one word line WL is activated.

Since in the end memory cell array blocks 10-1 and 10-n, half of the memory cells connected to the selected word line WL1 are the dummy memory cells, in order to satisfy the same condition as a case where the central memory cell array block is selected, twice as many word lines should be activated. Thus, if the end memory cell array blocks 10-1 and 10-n are selected, since twice as many word lines as when the central memory cell array blocks 10-2 to 10-(n−1) are selected should be activated, a larger boosting voltage is required.

FIG. 2 is a block diagram illustrating a boosting voltage generating circuit of a conventional semiconductor memory device. The boosting voltage generating circuit 200 includes: a boosting voltage VPP activating signal generator 15 which outputs a boosting voltage enable signal VPP-EN1 in response to an activation signal of a row address strobe signal RAS/; a first boosting voltage generating means 110 which operates in response to the boosting voltage enable signal VPP-EN1 to output a boosting voltage higher than a power supply voltage to an output terminal; a second boosting voltage generating means 120 which is enabled in response to the boosting voltage enable signal VPP-EN1 and receives the boosting voltage of the output terminal to detect whether the boosting voltage VPP is maintained at an appropriate target level to perform a pumping operation; and a third boosting voltage generating means 130 which is enabled when the power supply voltage VDD is applied in standby and active is modes and receives the boosting voltage of the output terminal to detect whether the boosting voltage VPP is maintained at an appropriate target level to perform a pumping operation.

The first boosting voltage generating means 110 is always activated in the active mode and includes a boosting voltage VPP driving means 25 which is synchronized with the boosting voltage enable signal VPP-EN1 to operate, a first driving signal generator 5 for outputting a first driving signal DRV1 in response to an output signal of the driving means 25, and first and second pumps 3 and 13 for supplying boosting voltage charge to an output terminal in response to the first driving signal DRV1.

The second boosting voltage generating means 120 is selectively activated in the active mode and includes an active boosting voltage VPP level detector 35 which operates in response to the boosting voltage enable signal VPP-EN1 and the level of the boosting voltage VPP of the output terminal, a second driving signal generator 55 for outputting a second driving signal DRV2 in response to an output signal of the detector 35, and third and fourth pumps 23 and 33 for supplying boosting voltage charge to an output terminal in response to the second driving signal DRV2.

The third boosting voltage generating means 130 always operates in the standby and active modes and includes a standby boosting voltage level detector 45 which operates in response to the power supply voltage and the level of the boosting voltage VPP, a third driving signal generator 65 for outputting a third driving signal in response to an output signal of the detector 45, and a fifth pump 43 for supplying boosting voltage charge which is necessary to an output terminal in response to the third driving signal DRV3.

The second boosting voltage generating means 120 detects whether or not the boosting voltage is maintained at an appropriate level in the active mode and performs a pumping operation through the third and fourth pumps 23 and 33 to supply additional charge to the output terminal to thereby maintain the level of the boosting voltage constant when it is lower than the appropriate level.

However, in the semiconductor memory device of the open bit line structure, when the end memory cell array blocks 10-1 and 10-n are selected, the boosting voltage is excessively lower than when the central memory cell array blocks 10-2 to 10-(n−1) are selected. Consequently, it is difficult to rapidly compensate for insufficient charge to maintain the boosting voltage at a constant level.

SUMMARY OF THE INVENTION

The present invention is directed to a semiconductor memory device in which a boosting voltage remains constant regardless of selected memory cell array blocks.

In one aspect of the present invention, a semiconductor memory device includes: a memory cell array including a plurality of memory cell array blocks in turn including first and second memory cell array blocks, the number of word lines activated when the first memory cell array blocks are selected being greater than the number of word lines activated when the second memory cell array blocks are selected; a first boosting voltage generating means generating a first driving signal when the semiconductor memory device operates in an active mode and supplying a boosting voltage that is higher than a power supply voltage to an output terminal in response to the first driving signal; and a second boosting voltage generating means including first and second boosting voltage generators, the first boosting voltage generator generating a second driving signal when a level of the boosting voltage of the output terminal is below a target level in the active mode and pumping the boosting voltage in response to the second driving signal, the second boosting voltage generator pumping the boosting voltage in response to the first driving signal when the first memory cell array blocks are selected and pumping the boosting voltage in response to the second driving signal when the second memory cell array blocks are selected.

In one embodiment, the first memory cell array blocks include at least two memory cell array blocks located in an end region of the memory cell array, and the word lines respectively corresponding to the at least two memory cell array blocks may be simultaneously activated.

In another embodiment, the first boosting voltage generating means includes: a first boosting voltage level detector generating a first detecting signal in response to the boosting voltage enable signal; a first driving signal generator generating the first driving signal in response to the first detecting signal; and a first pumping means for pumping the boosting voltage in response to the first driving signal. In another embodiment, the first pumping means includes first and second pumps pumping the boosting voltage in response to the first driving signal.

In another embodiment, the first boosting voltage generator includes: a second boosting voltage level detector detecting the level of the boosting voltage to generate a second detecting signal in response to the boosting voltage enable signal; a second driving signal generator generating the second driving signal in response to the second detecting signal; and a third pump pumping the boosting voltage in response to the second driving signal. In another embodiment, the second boosting voltage level detector includes: a first inverter inverting the boosting voltage enable signal to generate an inverted boosting voltage enable signal; a differential amplifier amplifying the difference between a reference voltage and a feedback voltage; a feedback voltage generator enabled in response to the boosting voltage enable signal and the inverted boosting voltage enable signal and lowering the boosting voltage in response to an output signal of the differential amplifier to generate the feedback voltage; and a second inverter generating the second detecting signal in response to the output signal of the differential amplifier. In another embodiment, the feedback voltage generator includes: a PMOS transistor connected to the boosting voltage and turned on in response to the inverted boosting voltage enable signal; an NMOS transistor connected to a ground voltage and turned on in response to the boosting voltage enable signal; and a plurality of PMOS transistors serially connected between the PMOS transistor and the NMOS transistor and lowering the boosting voltage in response to the output signal of the differential amplifier to generate the feedback voltage.

In another embodiment, the second boosting voltage generator includes: a block decoder activating a selecting signal in response to an address signal for selecting the first memory cell array blocks and inactivating the selecting signal in response to the address signal for selecting the second memory cell array blocks; a third driving signal generator outputting the first driving signal as a third driving signal when the selecting signal is activated and outputting the second driving signal as the third driving signal when the selecting signal is inactivated; and a fourth pump pumping the boosting voltage in response to the third driving signal.

In another embodiment, the semiconductor memory device further comprises a third boosting voltage generating means for pumping the boosting voltage according to the level of the boosting voltage when the semiconductor device operates in standby and active modes.

In another embodiment, the third boosting voltage generating means includes: a third boosting voltage level detector generating a third detecting signal in response to the power supply voltage and the boosting voltage; a fourth driving signal generator outputting a fourth driving signal in response to the third detecting signal; and a fifth pump outputting the boosting voltage to the output terminal in response to the fourth driving signal. In another embodiment, the third boosting voltage level detector includes: a differential amplifier amplifying the difference between a reference voltage and a feedback voltage; a feedback voltage generator enabled in response to the power supply voltage and lowering the boosting voltage to generate the feedback voltage in response to an output signal of the differential amplifier; and an inverter generating the third detecting signal in response to the output signal of the differential amplifier. In another embodiment, the feedback voltage generator includes: a PMOS transistor connected to the boosting voltage and turned on in response to the power supply voltage; an NMOS transistor connected to a ground voltage and turned on in response to the power supply voltage; and a plurality of PMOS transistors serially connected between the PMOS transistor and the NMOS transistor and lowering the boosting voltage in response to the output signal of the differential amplifier to generate the feedback voltage.

BRIEF DESCRIPTION OF THE DRAWINGS

The foregoing and other objects, features and advantages of the invention will be apparent from the more particular description of preferred embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

Figure 1:
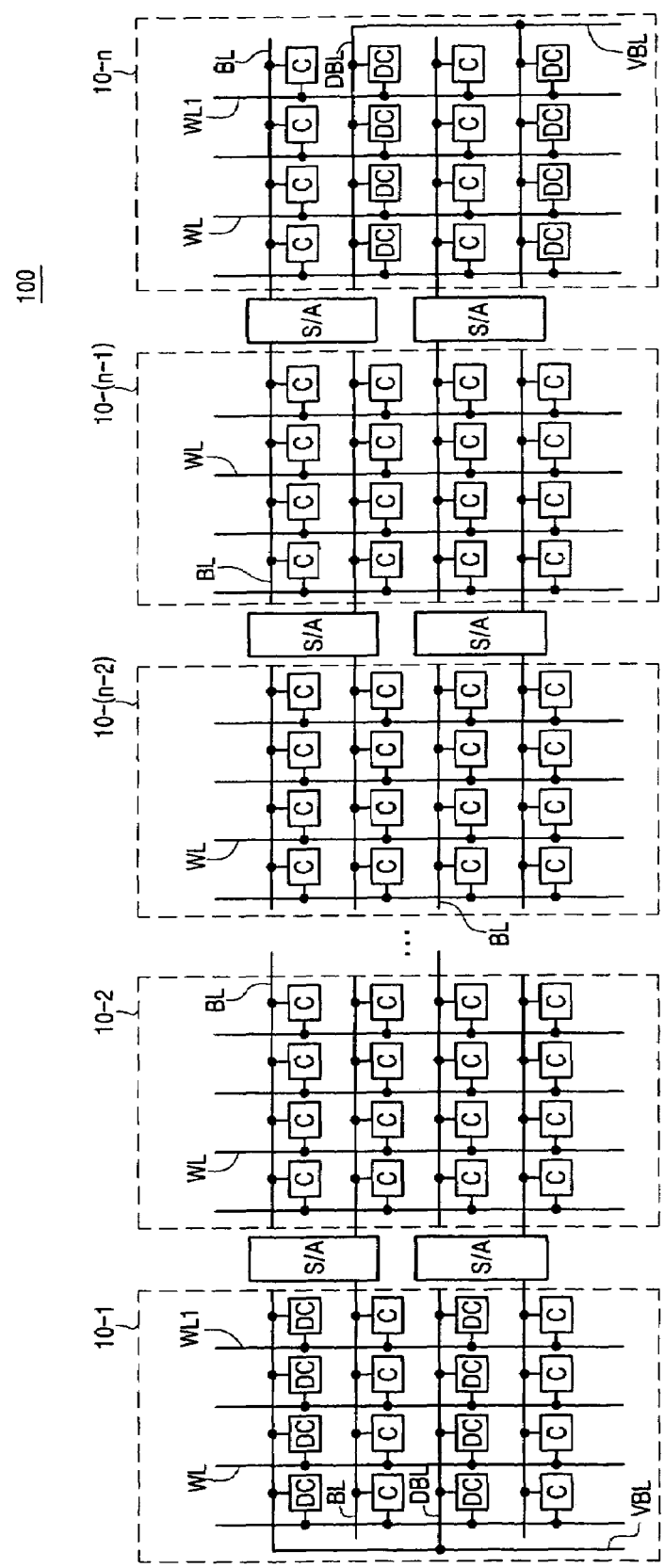
FIG. 1 is a schematic view illustrating a conventional memory cell array of an open bit line structure.
Figure 2:
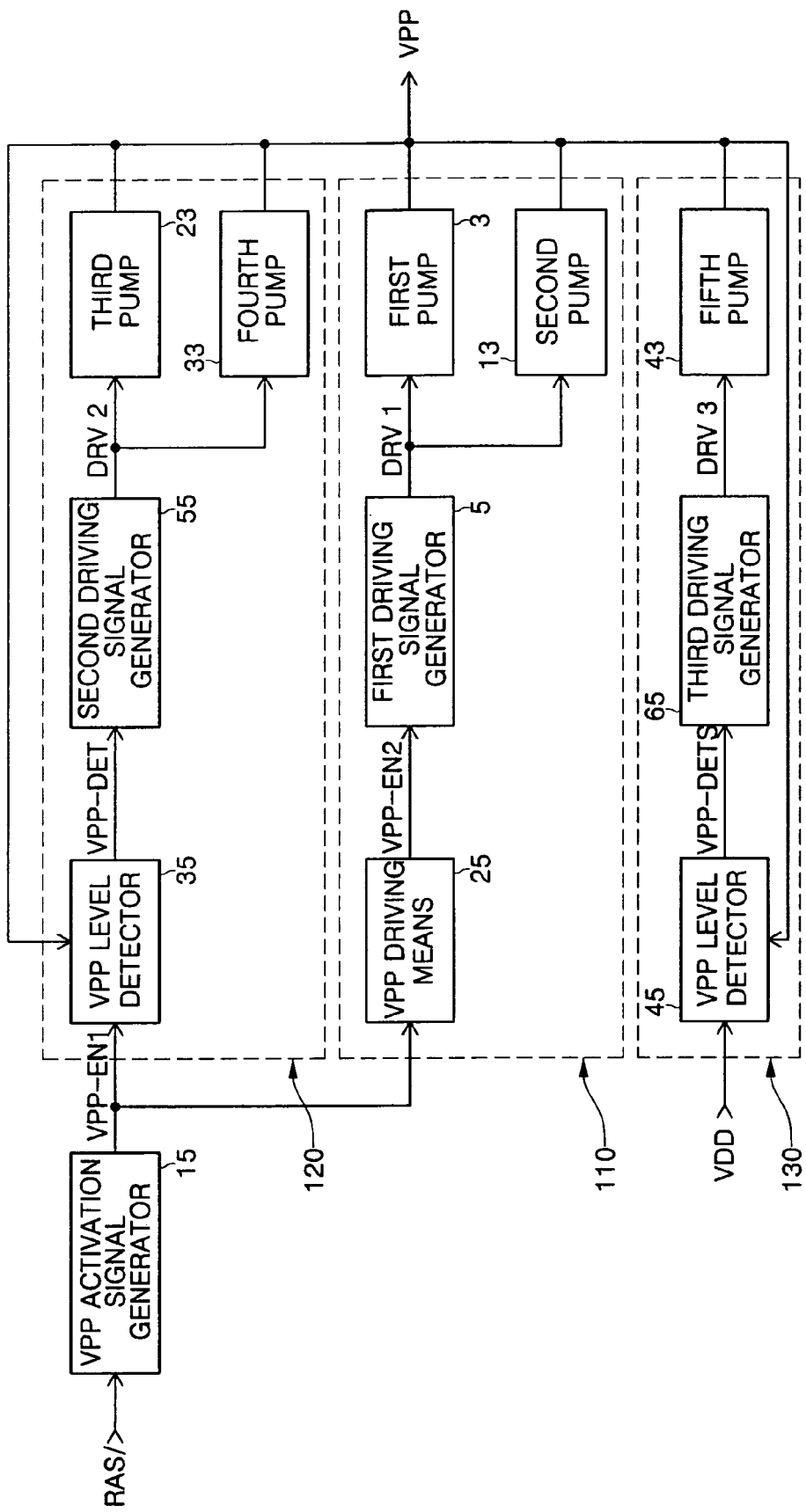
FIG. 2 is a block diagram illustrating a boosting voltage generating circuit of a conventional semiconductor memory device.

The present invention will now be described more fully with reference to the accompanying drawings, in which preferred embodiments of the invention are shown. This invention may, however, be embodied in different forms and should not be construed as limited to the embodiments set forth herein. Like reference numerals refer to like elements throughout the specification and drawings.

Figure 3:
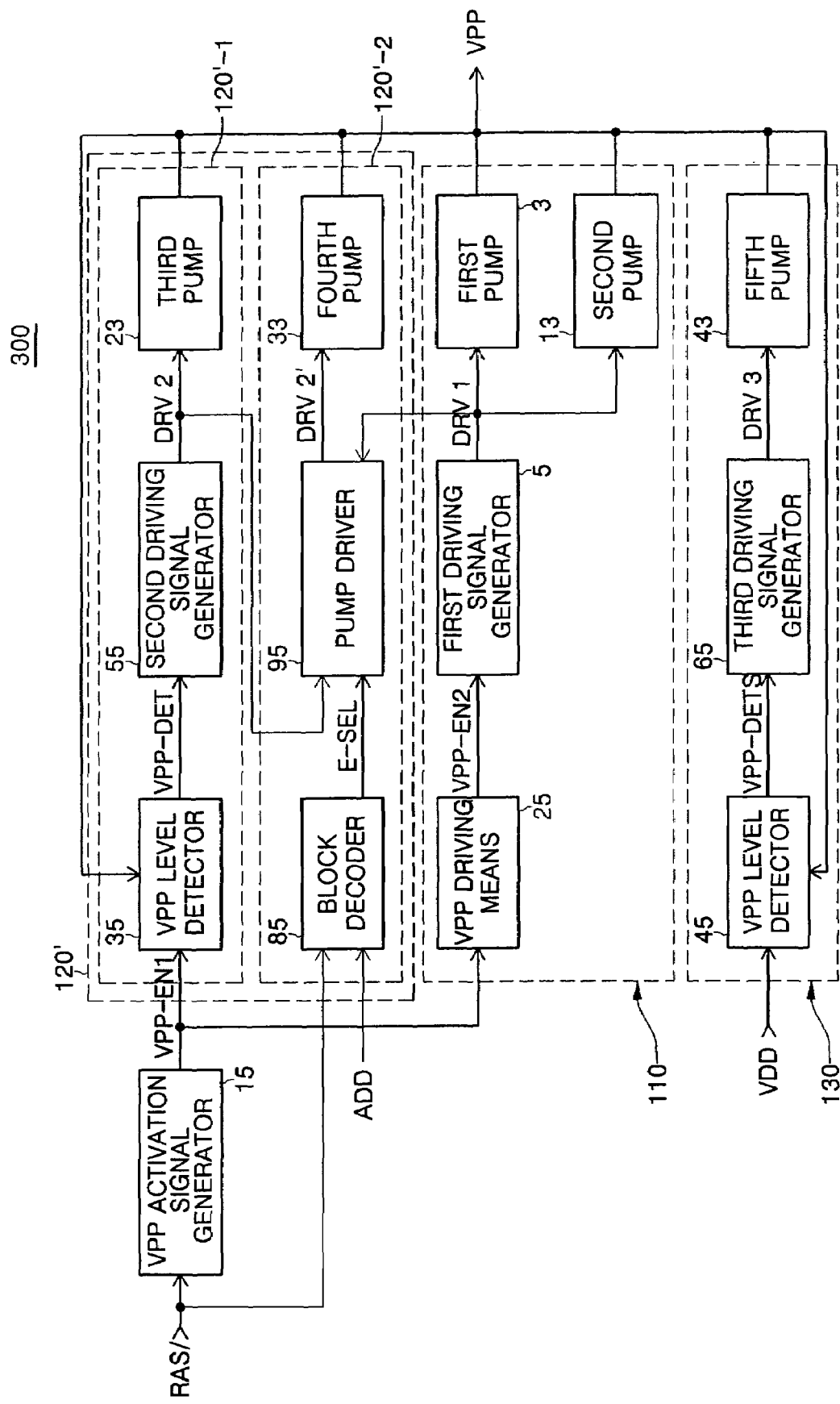
FIG. 3 is a block diagram illustrating a boosting voltage generating circuit of a semiconductor memory device according to the present invention.

FIG. 3 is a block diagram illustrating a boosting voltage generating circuit of a semiconductor memory device of the present invention. The boosting voltage generating circuit 300 includes a boosting voltage activation signal generator 15, a first boosting voltage generating means 110, a second boosting voltage generating means 120', and a third boosting voltage generating means 130. The second boosting voltage generating means 120' includes a first boosting voltage generator 120'-1 and a second boosting voltage generator 120'-2.

The first boosting voltage generating means 110 includes a boosting voltage driving means 25, a first driving signal generator 5, a first pump 3, and a second pump 13. The first boosting voltage generator 120'-1 of the second boosting voltage generating means 120' includes an active boosting voltage VPP level detector 35, a second driving signal generator 55, and a third pump 23, and the second boosting voltage generator 120'-2 includes a block decoder 85, a pump driver 95, and a fourth pump 33. The third boosting voltage generating means 130 includes a standby boosting voltage VPP level detector 45, a third driving signal generator 65, and a fifth pump 43.

The functions of the components of FIG. 3 are explained below.

The first boosting voltage generating means 110 is always activated in the active mode. That is, when the row address strobe signal RAS/ is activated to a low level, the semiconductor memory device enters the active mode. At this time, a boosting voltage enable signal VPP-EN1 is activated, so that the boosting voltage driving means 25 outputs a driving signal VPP-EN2 of a high level to drive the first driving signal generator 5. The first driving signal generator 5 outputs a first driving signal DRV1 in response to an activation signal of the driving signal VPP-EN2, and the first and second pumps 3 and 13 perform the pumping operation in response to the first driving signal DRV1 to supply the pumping charge to the output terminal to maintain the boosting voltage at a level that is higher than that of the power supply voltage.

The first boosting voltage generator 120'-1 of the second boosting voltage generating means 120' selectively operates in the active mode in response to the boosting voltage enable signal VPP-EN1 and the boosting voltage VPP of the output terminal. The active boosting voltage level detector 35 outputs a detecting signal VPP-DET of a low level when the boosting voltage is maintained at at least the appropriate voltage level, and outputs the detecting signal VPP-DET of a high level when a level of the boosting voltage drops below the appropriate voltage level. The second driving signal generator 55 outputs a second driving signal DRV2 to the third pump 23 in response to the activated detecting signal. The third pump 23 supplies the pumping charge to the output terminal in response to the second driving signal DRV2, so that the boosting voltage VPP is increased to maintain the appropriate level.

The second boosting voltage generator 120'-2 of the second boosting voltage generating means 120' always operates when the word line of the end memory cell array blocks 10-1 and 10-n is activated, thereby supplying the pumping charge to the output terminal. On the other hand, the second boosted voltage generator 120'-2 operates together with the first boosting voltage generator 120'-1 only when the level of the boosting voltage goes down when the word line of the central memory cell array blocks 10-2 to 10-(n−1) is activated. That is, the second boosting voltage generator 120'-2 is a circuit which selectively operates depending on the selected memory cell array block.

The block decoder 85 operates in response to the activation signal of the row address strobe signal RAS/ and an address signal ADD and outputs an activated block selecting signal E-SEL only when the end memory cell array blocks 10-1 and 10-n are selected. That is, if the central memory cell array blocks 10-2 to 10-(n−1) are selected, the block selecting signal E-SEL is inactivated.

The pump driver 95 outputs an activated third driving signal DRV2' in response to the first driving signal DRV1 when the block selecting signal E-SEL is activated. However, when the block selecting signal E-SEL is inactivated, the pump driver 95 outputs the activated third driving signal DRV2' in response to the second driving signal DRV2.

That is, if the word line of the end memory cell array blocks 10-1 and 10-n is activated, the block selecting signal is always activated regardless of the second driving signal DRV2, and thus sufficient pumping charge is supplied to the output terminal by the second boosting voltage generator 120'-2. As a result, the level of the supplied boosting voltage VPP can always be kept constant when the end memory cell array blocks 10-1 and 10-n are selected, even though twice as many word lines are activated as when the central memory cell array blocks 10-2 to 10-(n−1) are selected.

The third boosting voltage generating means 130 operates in the standby mode and the active mode. That is, while the power supply voltage VDD is applied, the standby boosting voltage VPP level detector 45 which always detects the level of the boosting voltage VPP outputs the activated detecting signal VPP-DETS of a high level to the third driving signal generator 65 when the level of the boosting voltage VPP deviates from a range of the appropriate voltage level. The third driving signal generator 65 outputs/a fourth driving signal DRV3 to the fifth pump 43 in response to the detecting signal VPP-DETS in the standby mode and the active mode to thereby supply the pumping charge to the output terminal.

Figure 4:
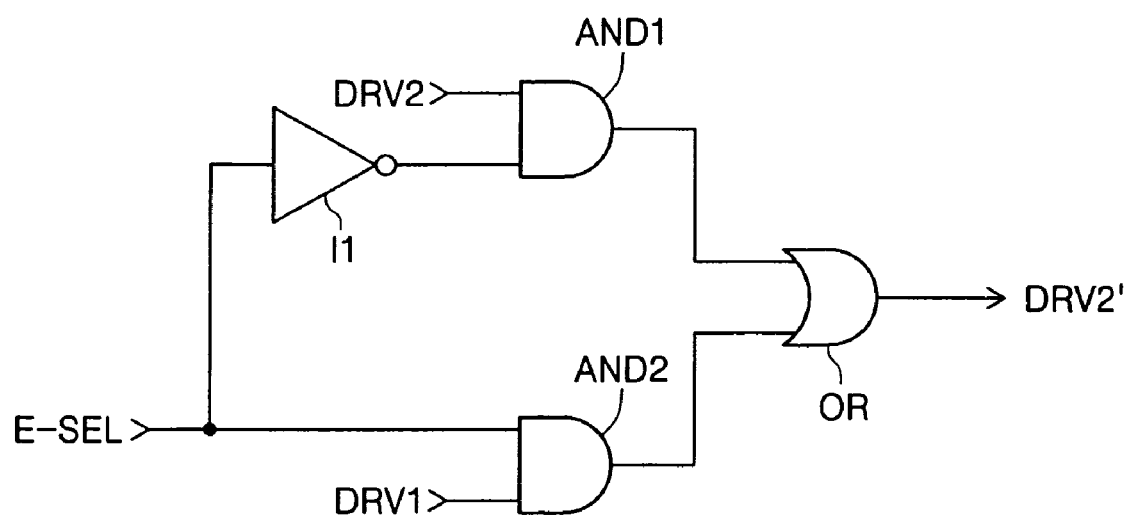
FIG. 4 is a circuit diagram illustrating a pump driver of the present invention.

FIG. 4 is a circuit diagram illustrating the pump driver of the present invention. The pump driver 95 includes an inverter 11, AND gates AND1 and AND2, and an OR gate OR.

That is, the pump driver 95 includes a first AND gate AND1 which receives an inverted signal of the block selecting signal E-SEL and the second driving signal DRV2, a second AND gate AND2 which receives the block selecting signal E-SEL and the fourth driving signal DRV3, and an OR gate OR which performs an OR operation on the output signal of the first AND gate AND1 and the output signal of the second AND gate AND2 to output the third driving signal DRV2'.

The operation of the pump driver 95 is now explained. When the word line of the edge memory blocks 10-1 and 10-n is selected, the block selecting signal is activated to a high level. The first AND gate AND1 always outputs an output signal of a low level to the OR gate OR. The second AND gate AND2 receives the first driving signal DRV1 in the active mode to output the driving signal toggling to a high or low level to the OR gate OR. Thus, the OR gate OR generates the third driving signal DRV2' toggling according to the first driving signal DRV1. The fourth pump 33 performs the pumping operation in response to the third driving signal DRV2' to maintain a constant level of the boosting voltage VPP.

On the other hand, when the word line of the central memory blocks 10-2 to 10-*n* is selected, the block selecting signal E-SEL is inactivated. The second AND gate AND2 always outputs the output signal of a low level to the OR gate OR. However, the first AND gate AND1 can output the driving signal activated according to the second driving signal to the OR gate OR. That is, if the level of the boosting voltage deviates from the appropriate voltage level range and the second driving signal DRV2 is activated by the boosting voltage level detector 35, the third driving signal DRV2' is also activated to supply the pumping charge to the output terminal, so that the level of the boosting voltage VPP which temporarily dropped down is recovered to the appropriate boosting voltage level.

Figure 5:
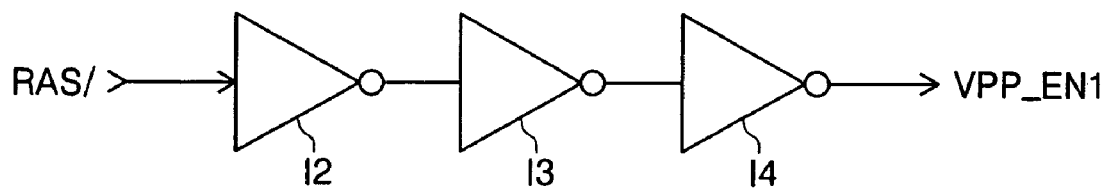
FIG. 5 is a circuit diagram illustrating a boosting voltage activation signal generator of the present invention.

FIG. 5 is a circuit diagram illustrating the boosting voltage activation signal generator of the present invention. The boosting voltage activation signal generator 15 includes inverters 12, 13, and 14. If the row address strobe signal RAS/ applied from the external terminal is activated to a low address and so it enters the active mode, the inverters 12, 13, and 14 output the boosting voltage enable signal VPP-EN1 of a high level as the activation signal.

FIG. 5 shows the boosting voltage activation signal generator 15 as including three inverters. In other embodiments, however, the boosting voltage activation signal generator 15 can include any odd number of inverters greater than 3.

Figure 6:
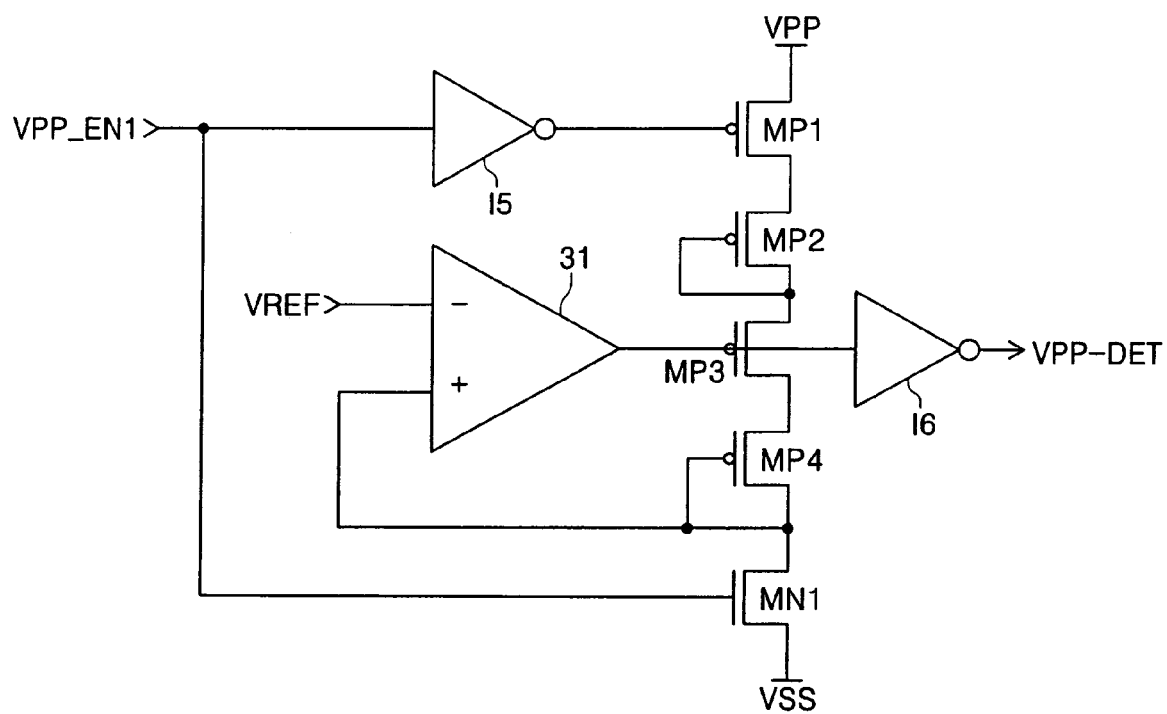
FIG. 6 is a circuit diagram illustrating an active boosting voltage level detector of the present invention.

FIG. 6 is a circuit diagram illustrating the active boosting voltage level detector of the present invention. The active boosting voltage level detector 35 includes inverters 15 and 16, PMOS transistors MP1 to MP4, an NMOS transistor N1, and a differential amplifier 31. In FIG. 6, the PMOS transistors MP1 to MP4 and the NMOS transistor MN1 constitute the feedback voltage generator which generates the feedback voltage.

Operation of the active boosting voltage level detector of FIG. 6 is now explained. If the boosting voltage enable signal VPP-EN1 is activated to a high level, the PMOS transistor MP1 and the NMOS transistor MN1 are turned on, so that it is possible to detect the level of the boosting voltage from one terminal of the PMOS transistor MP1. For example, if the level of the boosting voltage is lower than a predetermined voltage level, the level of the feedback voltage which is fed back to the differential amplifier 31 through the PMOS transistor MP4 is lower than the reference voltage VREF. Here, the differential amplifier 31 is controlled to have a level which is lower than the level of the output terminal. The output terminal of the differential amplifier 31 has an analog level. The resistance value of the PMOS transistor MP3 is smaller in response to the output signal of the differential amplifier 31, and thus the feedback voltage is greater. The second inverter 12 outputs the detecting signal VPP-DET of a high level. The first boosting voltage generator 120'-1 of the second boosting voltage generating means 120' performs the pumping operation to supply the pumping charge to the boosting voltage VPP output terminal. As a result, the boosting voltage returns to the appropriate voltage level range.

On the other hand, if the boosting voltage maintains the appropriate voltage level, the voltage level fed back to the differential amplifier is higher than the reference voltage VREF, and so the differential amplifier 31 increases the voltage of the output terminal. The resistance value of the PMOS transistor MP3 is greater in response to the output signal of the differential amplifier 31, and thus the feedback voltage is smaller. Thus, the second inverter 12 outputs the inactivated detecting signal VPP-DET of a low level. As a result, the first boosting voltage generator 120'-1 of the second boosting voltage generating means 120' does not perform the pumping operation.

Figure 7:
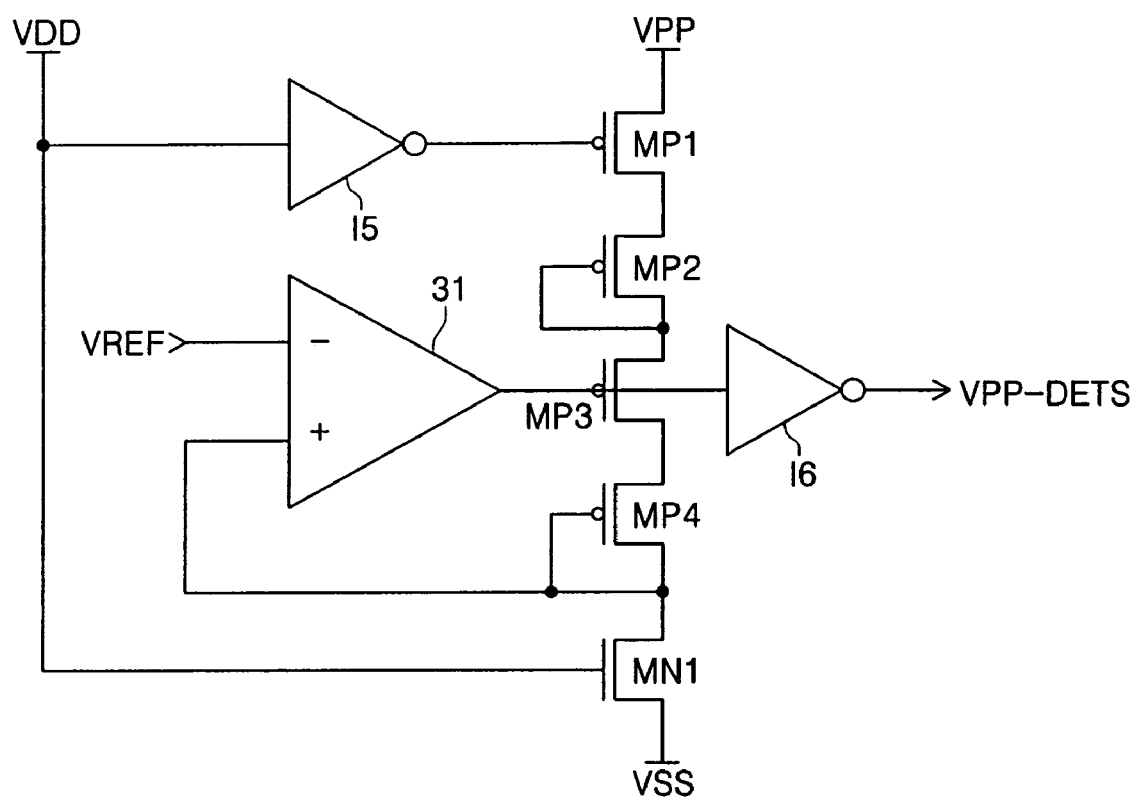
FIG. 7 is a circuit diagram illustrating a standby boosting voltage level detector of the present invention.

FIG. 7 is a detailed circuit diagram of the standby boosting voltage level detector 45. The standby boosting voltage level detector 45 of FIG. 7 has the same configuration as the active boosting voltage level detector 35 of FIG. 6 except that the power supply voltage VDD is applied instead of the boosting voltage enable signal VPP-EN1.

The standby boosting voltage level detector of FIG. 7 operates in the same way as the active boosting voltage level detector of FIG. 6. The only difference is that the standby boosting voltage level detector is not enabled in response to the boosting voltage enable signal VPP-EN1 but is enabled to generate the detecting signal VPP-DETS when the power supply voltage VDD is applied.

Thus, the active boosting voltage level detector of FIG. 6 is enabled to generate the detecting signal VPP-DET when it is in the active mode, but the standby boosting voltage level detector of FIG. 7 is enabled to generate the detecting signal VPP-DETS when it is in the standby and active modes.

As described above, according to the embodiment of the present invention, the semiconductor memory device having a memory cell array structure of the open bit line structure can supply a stable boosting voltage so that it is possible to prevent problems that otherwise might occur such as degradation of refresh or data access characteristics of the semiconductor device.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device, comprising:
a memory cell array including a plurality of memory cell array blocks in turn including first and second memory cell array blocks, a number of word lines activated when the first memory cell array blocks are selected being greater than a number of word lines activated when the second memory cell array blocks are selected;
a first boosting voltage generating means generating a first driving signal when the semiconductor memory device operates in an active mode and supplying a boosting voltage that is higher than a power supply voltage to an output terminal in response to the first driving signal; and
a second boosting voltage generating means including first and second boosting voltage generators, the first boosting voltage generator generating a second driving signal when a level of the boosting voltage of the output terminal is below a target level in the active mode and pumping the boosting voltage in response to the second driving signal, the second boosting voltage generator pumping the boosting voltage in response to an activated third driving signal, the third driving signal being activated in response to the first driving signal when the first memory cell array blocks are selected as indicated by a selecting signal, and in response to the second driving signal when the second memory cell array blocks are selected as indicated by the selecting signal.

2. The device of claim 1, wherein the first memory cell array blocks include at least two memory cell array blocks located in an end region of the memory cell array, and the word lines respectively corresponding to the at least two memory cell array blocks are simultaneously activated.

3. The device of claim 2, further comprising a third boosting voltage generating means for pumping the boosting voltage according to the level of the boosting voltage when the semiconductor device operates in standby and active modes.

4. The device of claim 3, wherein the third boosting voltage generating means includes:
a third boosting voltage level detector generating a third detecting signal in response to the power supply voltage and the boosting voltage;
a fourth driving signal generator outputting a fourth driving signal in response to the third detecting signal; and
a fifth pump outputting the boosting voltage to the output terminal in response to the fourth driving signal.

5. The device of claim 4, wherein the third boosting voltage level detector includes:
a differential amplifier amplifying the difference between a reference voltage and a feedback voltage;
a feedback voltage generator enabled in response to the power supply voltage and lowering the boosting voltage to generate the feedback voltage in response to an output signal of the differential amplifier; and
an inverter generating the third detecting signal in response to the output signal of the differential amplifier.

6. The device of claim 5, wherein the feedback voltage generator includes:
a PMOS transistor connected to the boosting voltage and turned on in response to the power supply voltage;
an NMOS transistor connected to a ground voltage and turned on in response to the power supply voltage; and
a plurality of PMOS transistors serially connected between the PMOS transistor and the NMOS transistor and lowering the boosting voltage in response to the output signal of the differential amplifier to generate the feedback voltage.

7. The device of claim 3, wherein the second boosting voltage generator includes:
a block decoder activating the selecting signal in response to an address signal for selecting the first memory cell array blocks and inactivating the selecting signal in response to the address signal for selecting the second memory cell array blocks;
a pumping driving signal generator outputting the first driving signal as the third driving signal when the selecting signal is activated and outputting the second driving signal as the third driving signal when the selecting signal is inactivated; and
a pump pumping the boosting voltage in response to the third driving signal.

8. The device of claim 1, further comprising a boosting voltage activation signal generator outputting a boosting voltage enable signal in response to an activation signal when the semiconductor device operates in the active mode.

9. The device of claim 8, wherein the first boosting voltage generating means includes:
a first boosting voltage level detector generating a first detecting signal in response to the boosting voltage enable signal;
a first driving signal generator generating the first driving signal in response to the first detecting signal; and
a first pumping means for pumping the boosting voltage in response to the first driving signal.

10. The device of claim 9, wherein the first pumping means includes first and second pumps pumping the boosting voltage in response to the first driving signal.

11. The device of claim 8, wherein the first boosting voltage generator includes:
a second boosting voltage level detector detecting the level of the boosting voltage to generate a second detecting signal in response to the boosting voltage enable signal;
a second driving signal generator generating the second driving signal in response to the second detecting signal; and
a third pump pumping the boosting voltage in response to the second driving signal.

12. The device of claim 11, wherein the second boosting voltage level detector includes:
a first inverter inverting the boosting voltage enable signal to generate an inverted boosting voltage enable signal;
a differential amplifier amplifying the difference between a reference voltage and a feedback voltage;
a feedback voltage generator enabled in response to the boosting voltage enable signal and the inverted boosting voltage enable signal and lowering the boosting voltage in response to
an output signal of the differential amplifier to generate the feedback voltage; and
a second inverter generating the second detecting signal in response to the output signal of the differential amplifier.

13. The device of claim 12, wherein the feedback voltage generator includes:
a PMOS transistor connected to the boosting voltage and turned on in response to the inverted boosting voltage enable signal;
an NMOS transistor connected to a ground voltage and turned on in response to the boosting voltage enable signal; and
a plurality of PMOS transistors serially connected between the PMOS transistor and the NMOS transistor and lowering the boosting voltage in response to the output signal of the differential amplifier to generate the feedback voltage.

14. The device of claim 11, wherein the second boosting voltage generator includes:
a block decoder activating the selecting signal in response to an address signal for selecting the first memory cell array blocks and inactivating the selecting signal in response to the address signal for selecting the second memory cell array blocks;
a third driving signal generator outputting the first driving signal as the third driving signal when the selecting signal is activated and outputting the second driving signal as the third driving signal when the selecting signal is inactivated; and
a fourth pump pumping the boosting voltage in response to the third driving signal.

* * * * *